United States Patent [19]
Nessi et al.

[11] Patent Number: 5,943,000
[45] Date of Patent: Aug. 24, 1999

[54] COMPENSATED MOS STRING AND DAC EMPLOYING SUCH A POTENTIOMETRIC STRING

[75] Inventors: Maurizio Nessi, Como; Rinaldo Castello, Arcore; Giona Fucili, Magneta; Marcello Leone, Rho; Annamaria Rossi, Genoa, all of Italy

[73] Assignee: SGS-Thomson Microelectronics S.r.L., Agrate Brianza, Italy

[21] Appl. No.: 08/956,273

[22] Filed: Oct. 22, 1997

[30] Foreign Application Priority Data

Oct. 24, 1996 [IT] Italy .................................. VA96A0022

[51] Int. Cl.$^6$ .............................. H03M 1/68; H03M 1/78
[52] U.S. Cl. ............................................ 341/154; 341/145
[58] Field of Search ..................................... 341/136, 144, 341/145, 154

[56] References Cited

U.S. PATENT DOCUMENTS

| | | | |
|---|---|---|---|
| 4,543,560 | 9/1985 | Holloway | 341/156 |
| 4,918,448 | 4/1990 | Hauviller et al. | 341/145 |
| 5,111,205 | 5/1992 | Morlon | 341/156 |
| 5,554,986 | 9/1996 | Neidorff | 341/145 |
| 5,648,780 | 7/1997 | Neidorff | 341/154 |

Primary Examiner—Howard L. Williams
Assistant Examiner—Peguy JeanPierre
Attorney, Agent, or Firm—Allen, Dyer, Doppelt, Milbrath & Gilchrist, P.A.

[57] ABSTRACT

A digital-to-analog converter includes a potentiometric string suitable for realizing a relatively high number of bits that significantly reduces the silicon area requirement and simplifies mismatch compensation. The structure includes a first resistance string to realize a first DAC to convert a first number of most significative bits, and a second potentiometric string functionally connected in cascade to the first, but realized with MOS transistors. The structure of the invention allows the coupling of the two DACs in cascade by exploiting the MOS transistors that form the second potentiometric string, that is, the second DAC, thus avoiding the use of operational switches or amplifiers which may provide error sources. Moreover, the structure of the invention lends itself to the implementation of efficient compensation circuits for integral and differential linearity errors.

12 Claims, 6 Drawing Sheets

COMPENSATED MOS STRING AND DAC EMPLOYING SUCH A POTENTIOMETRIC STRING

FIELD OF THE INVENTION

The present invention relates to integrated circuits, and, more particularly, to digital/analog and analog/digital converters.

BACKGROUND OF THE INVENTION

Integrated potentiometric strings are commonly used to realize digital/analog and analog/digital converters. The potentiometric string is used to make discrete a voltage applied to the two end terminals of a chain of resistors connected in series. To realize such converters of up to 8 bits, the embodiment of a resistive potentiometric string commonly comprises $2^n$ (where n is the number of bits) resistors in series, and, hence, integrated in the form of a unique resistive strip.

When more than 8 bits are required, the linear dimension of the integrated resistance tends to become cumbersome and inconvenient because of the large occupied area of silicon. Above all, it becomes difficult to control essential parameters, such as the differential and integral linearity of the potentiometric string. In these cases, the usual approach is that of subdividing the DAC converter into two structures connected in cascade. A first DAC is realized with a first resistive string to convert the first most significant bits (p). A second resistive string in then connected in cascade to the preceding one to enable the conversion of the remaining least significative bits (m) (p+m=n).

The different known architectures essentially differ in the manner in which the two resistive strings are coupled to each other. FIGS. 1a, 1b and 1c show the most common architectures of resistive strings. These approaches, while overcoming the problems related to the would-be excessive length of a unique integrated potentiometric string, still require a considerable area of integration on the silicon. They also impose heavy burdens for effectively compensating mismatches among the different resistance values.

SUMMARY OF THE INVENTION

A main object of the present invention is to provide a potentiometric string suitable for realizing a digital/analog converter of a relatively high number of bits and that significantly reduces the silicon area requirement and simplifies mismatch compensation.

This and other objects, features and advantages may be achieved by the structure of the present invention characterized in that it comprises a first resistance string to realize a first DAC circuit to convert a first number of most significative bits, and a second potentiometric string functionally connected in cascade to the first, but realized with MOS transistors. The structure of the invention allows the coupling of the two DACs in cascade by exploiting the MOS transistors that form the second potentiometric string, that is, the second DAC, thus avoiding the use of operational switches or amplifiers which may provide error sources. Moreover, the structure of the invention lends itself to the implementation of efficient compensation circuits for integral and differential linearity errors.

BRIEF DESCRIPTION OF THE DRAWINGS

The various aspects and advantages of the circuit of the invention will become clearer through the ensuing description of some important embodiments and upon referring to the attached drawings, wherein.

DETAILED DESCRIPTION OF THE PREFERRED EMBODIMENTS

Figure 2:
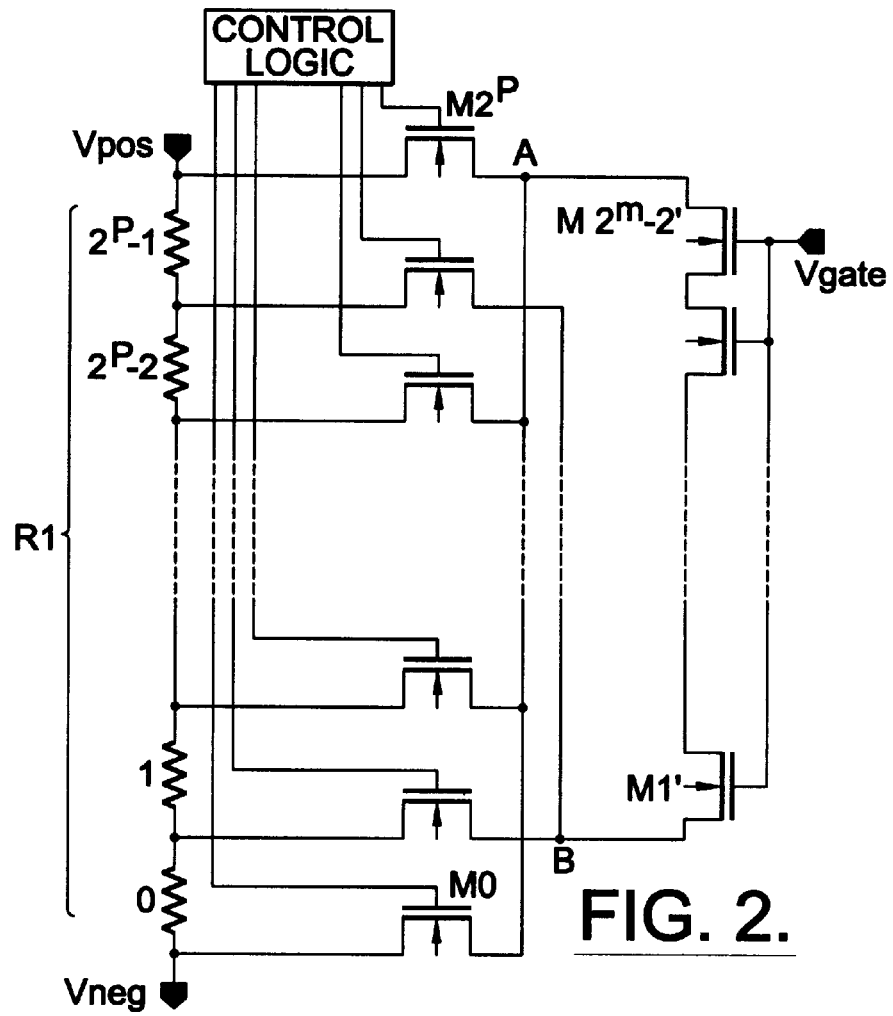
FIG. 2 is the schematic diagram of a DAC converter made according to the present invention.

The basic circuit of a DAC realized according to the present invention may be analyzed by referring to the example of FIG. 2, that is, an n=p+m bit DAC. Theoretically there are no limitations in attributing the values of the m and p parameters, and the following description or the diagrams shown in the figures are to be considered purely illustrative and in no way limiting the scope of legal protection of the present invention as defined in the appended claims.

As easily noticed from FIG. 2, the circuit is made up of $2^P$ resistors connected in series that, in practice, may be normally realized as a continuous resistive strip with $2^P+1$ taps (hereinbelow the total resistance of the strip will be referred to as R1). From these taps, $2^P+1$ voltage levels may be derived accurately. The remaining m bits of the DAC are implemented by realizing a second DAC in cascade to the preceding one.

According to a first and important aspect of the invention, this second DAC is realized by connecting each tap of the resistive array (that is, the continuous resistive strip) R1 that provides the first DAC to a first current terminal (the drain in the illustrated example) of a suitable gate driven MOS transistor. In the scheme of FIG. 2, these MOS transistors are designated as M0, M1 . . . M2$^P$, the other current terminal of which (the source, in the illustrated example) is alternately coupled to two common nodes: A and B. Between the two nodes A and B are connected a set of $2^m-2$ MOS transistors of the same type and size of the above noted MOS transistor, called M1', M2'. . . M2$^m$-2', respectively.

Figure 1C:
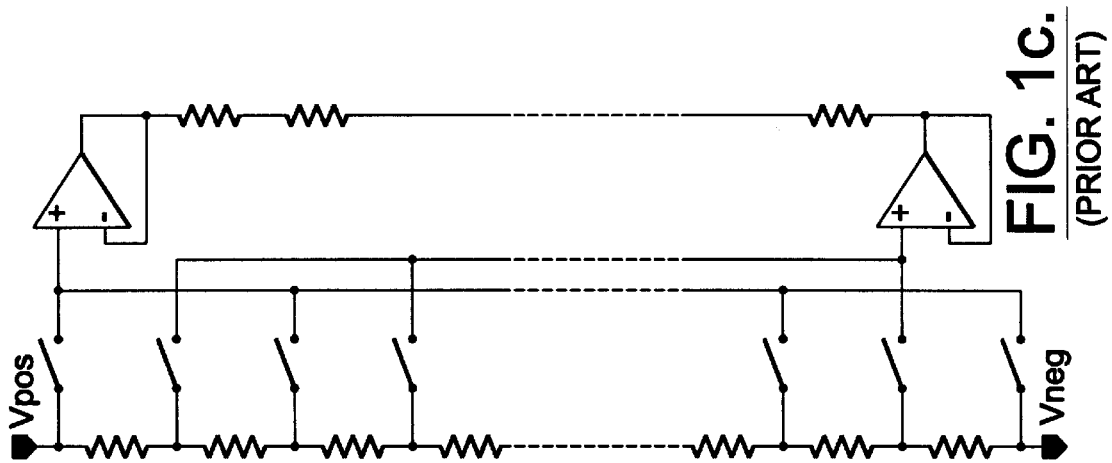
FIGS. 1a, 1b and 1c show, as already mentioned, known embodiments of resistive potentiometric strings of two DACs in cascade for achieving a resolution of a relatively large number of bits in accordance with the prior art.
Figure 1B:
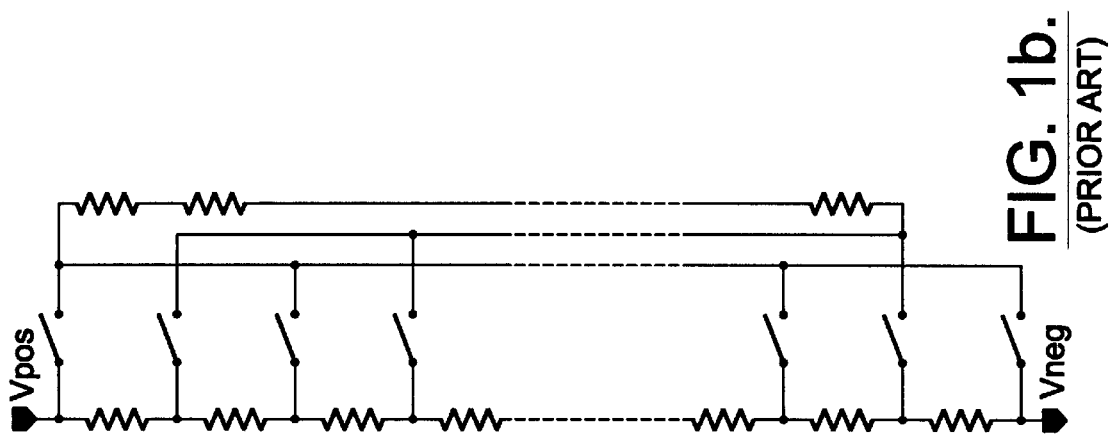
Figure 1A:
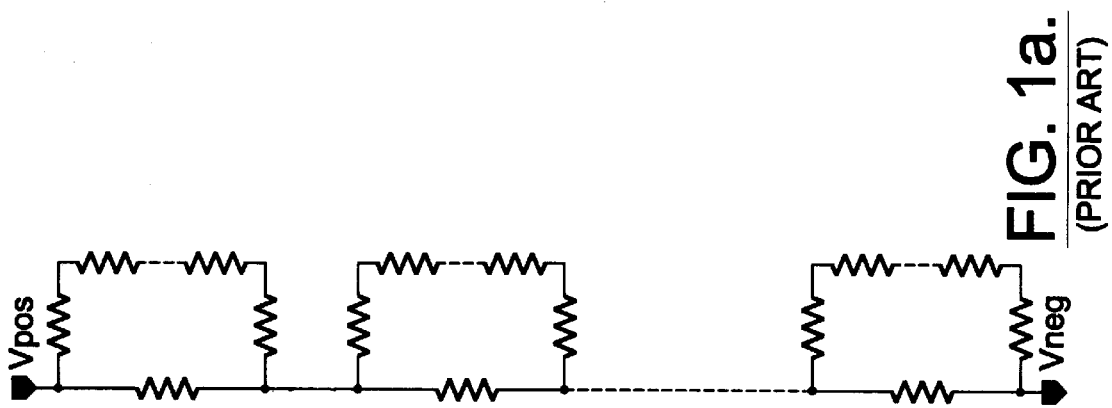

By suitably driving the MOS transistors (M0, M1 . . . M2$^P$), as described later, the effect of a resistive strip realized with $2^m$ MOS transistors is obtained, by virtue of the fact that such strip is operatively shiftable along the main resistive array R1. In this way, the following advantages are attained:

1) the second DAC of m-bits is effectively provided by $2^m$ elements in series shiftable along the p-bits of the main or first DAC instead of being provided by a matrix of $2^m*2^P$ elements as typical of subranging structures of known prior art schemes (see FIG. 1, for example); and 2) by realizing the series resistance of the m-bit DAC by way of MOS transistors it is possible to effectively shift the second m-bit DAC along the main p-bit DAC without the need for dedicated switches to connect the m-bit DAC to the main resistive strip R1, being this operation is intrinsically carried out by the same MOS transistors (M0, M1 . . . M2$^P$) which form the second m-bit DAC.

Figure 3A:
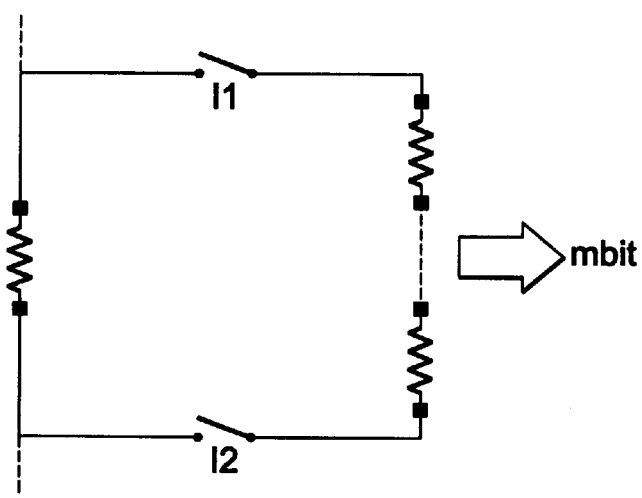
FIG. 3a is a partial circuit diagram evidencing the series resistance of the switches which may cause errors as in the prior art.
Figure 3B:
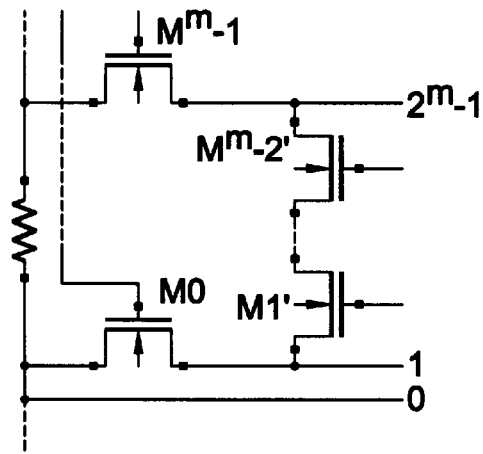
FIG. 3b is a partial circuit diagram showing the double function of the MOS transistors of the second MOS-resistive potentiometric string of the DAC scheme of the invention.

This very important difference is pointed out in FIGS. 3a and 3b, where a known system as shown in FIG. 3a and using a second m-bit DAC realized with resistors, is compared with a DAC system of the invention as shown in FIG. 3b that uses a second DAC realized with MOS transistors. In the first case, two switches I1 and I2 must be added in series to the second m-bit DAC to permit its shifting along the resistive strip R1 of the first DAC. Indeed the series resistance of the switches I1 and I2 provide an element of error of the conversion. In contrast, according to the scheme of the DAC of the invention of FIG. 3b, the MOS transistors M0, M1 . . . M2$^P$ operate as switches, though being parts of the m-bit DAC structure and as such they produce a uniform effect irrespective of the DAC configuration.

The advantageous architecture of the invention is hereinbelow analyzed in its various aspects to put into evidence the criticality and error factors, and to indicate ways to minimize inaccuracies, as well as to illustrate a preferred embodiment which also includes a special compensation circuit.

Figure 4:
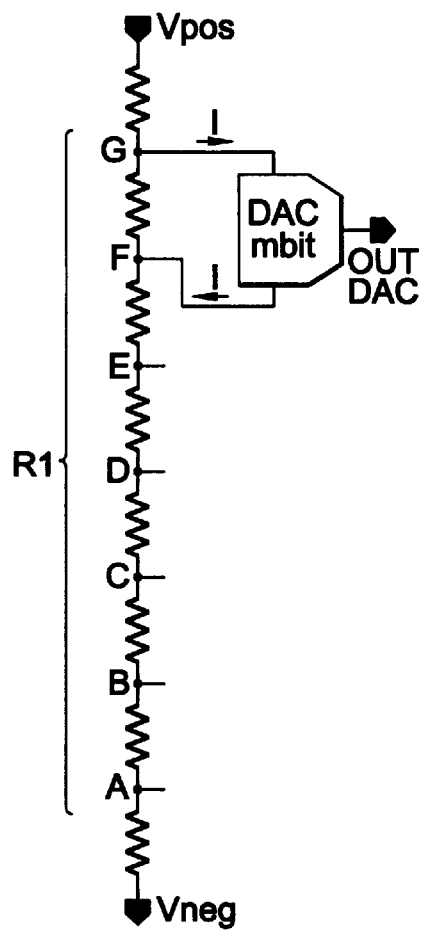
FIG. 4 is a simplified diagram showing the peculiarity of the functioning of the converter of the invention.

A generic m-bit DAC shiftable along the resistive strip R1 of a preceding DAC introduces some nonlinearities in the overall DAC system. By observing FIG. 4 (depicting, by way of example, a p=3 DAC) it can be noticed that by adding a second m-bit DAC in cascade thereto, a current absorption through the resistance R1 is introduced. This causes a variation in the voltage levels on the A, . . . , G nodes depending on the position of the second m-bit DAC along R1.

Figure 5:
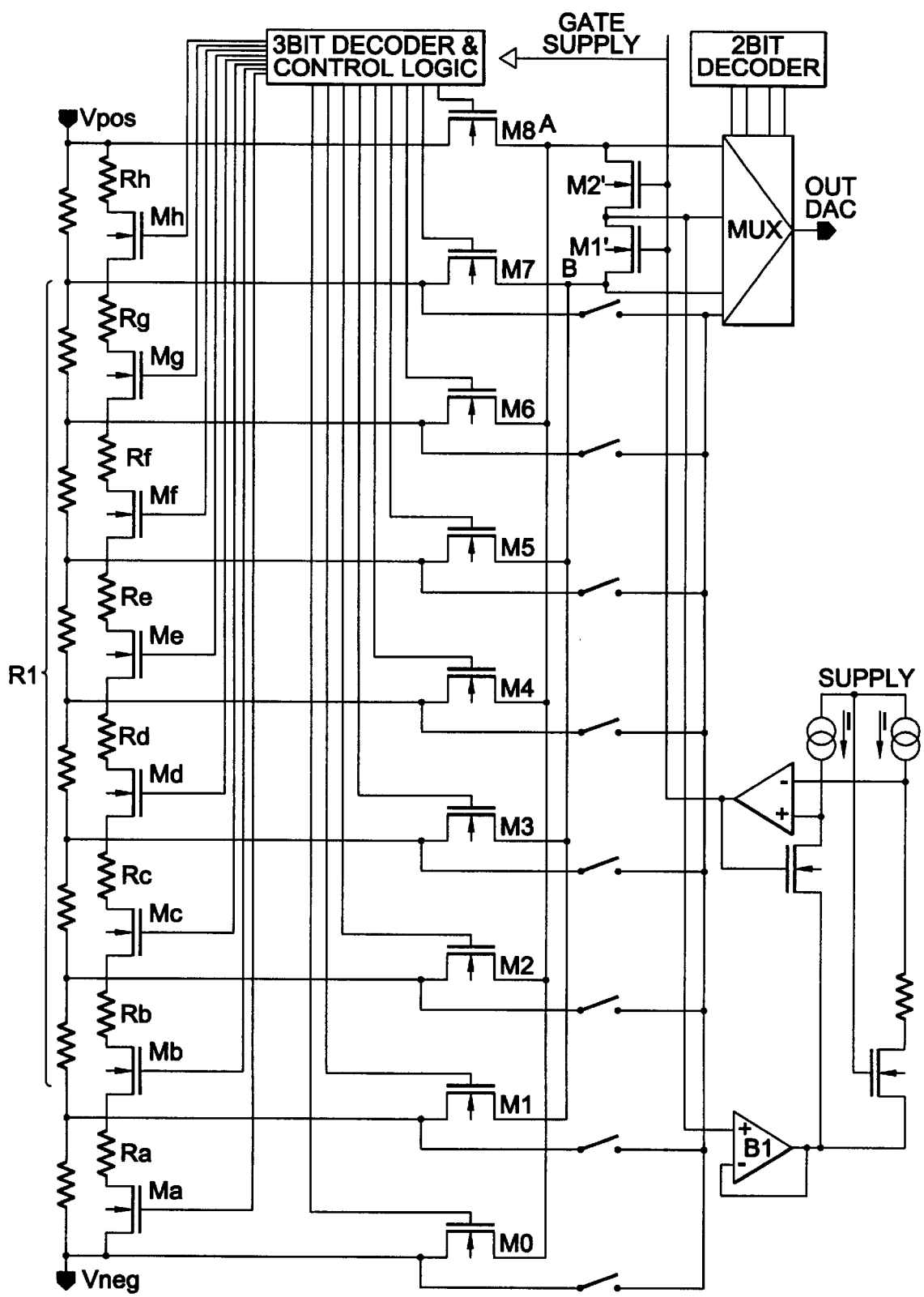
FIG. 5 is the diagram of a converter circuit of the invention according to a preferred embodiment that includes compensation devices.

In the particular architecture of the invention this fact may cause that when shifting the m-bit DAC realized with MOS transistors along R1, a modulation of the conductor resistance of the MOS transistors occurs, due essentially to so-called body effects. In fact, being that the body regions of all the MOS transistors are coupled to Vneg (see FIGS. 2, 4 and 5), the threshold voltage of the MOS transistors may significantly change upon varying their coupling position along R1. To avert the above noted effect, the basic structure of the DAC may be modified as illustrated in FIG. 5 (showing again, by way of example, the scheme of an n=p+m bit DAC, where p=3 and m=2).

Figure 6:
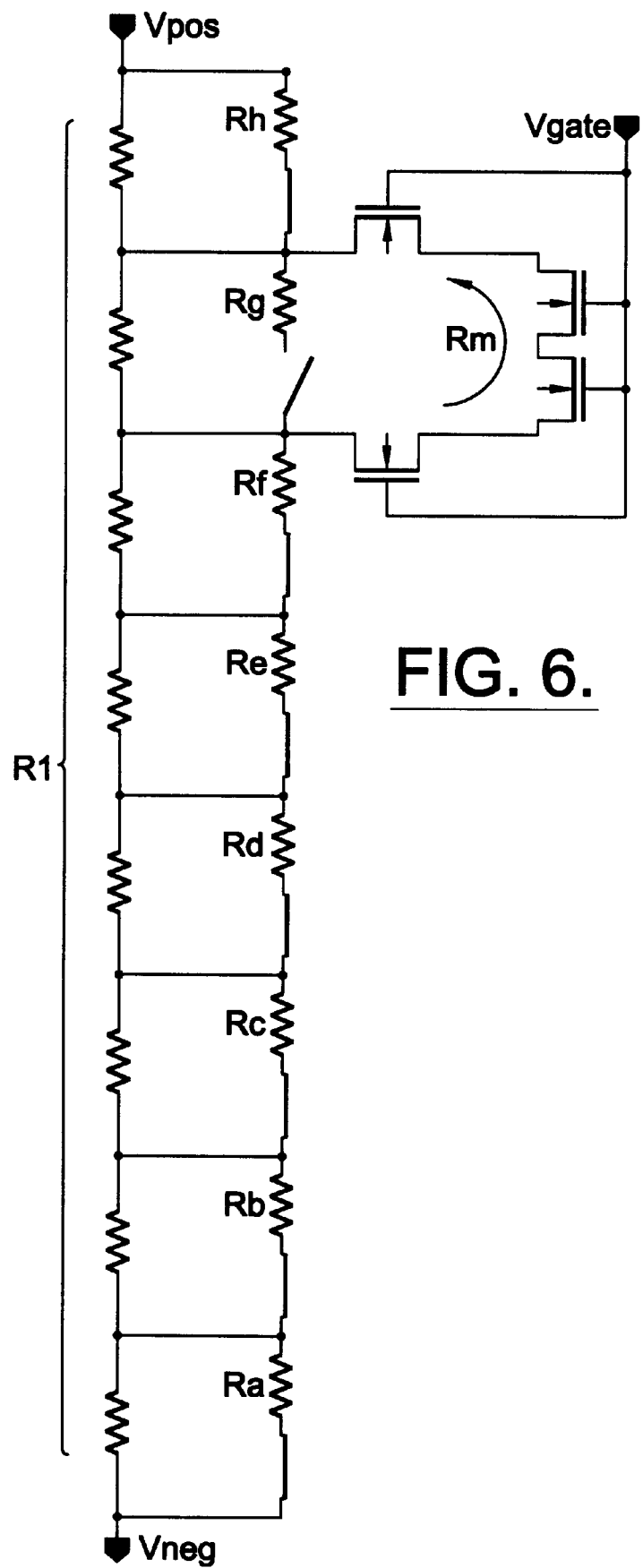
FIG. 6 schematically shows the equivalent circuit of the DAC of FIG. 5.

The value of the resistances Ra, . . . , Rh should be chosen to fulfill the relationship:

$$Ra=Rb=\ldots\ldots\ldots=Rh=2^m * Rmos$$

where Rmos is the resistance of a single MOS transistor of the m-bit DAC. The size of the transistors Ma, . . . , Mh should be sufficiently large to render their conduction resistance negligible if compared to the respective resistance Ra, . . . , Rh. The transistors Ma . . . Mh operate as switches to exclude the resistances Ra, . . . , Rh when connecting the chain of MOS transistors that form the m-bit DAC. Therefore, for each possible position of the m-bit DAC, an equivalent circuit of the type shown in FIG. 6 (p=3) will be obtained.

Figure 7:
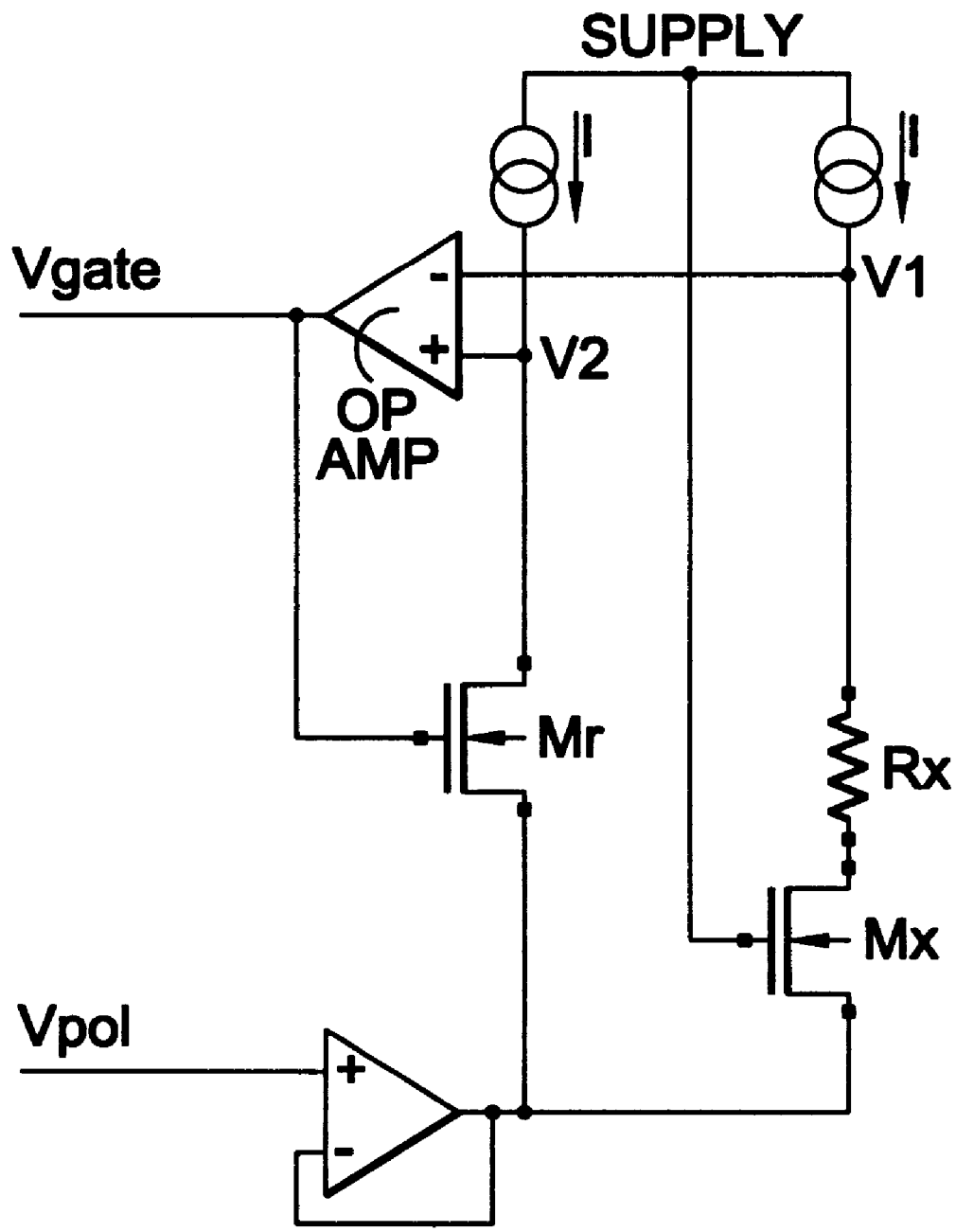
FIG. 7 is a partial diagram that emphasizes the compensation circuit of the DAC of FIG. 5.

In principle, the resistances Ra, . . . , Rh could also be realized using MOS transistors, to ensure a good coupling with the resistance Rm of the m-bit DAC even though the circuit may become more complicated. According to the embodiment of FIG. 7, such resistances are realized in the form of diffused resistances. Being that the spread of the resistances Ra, . . . , Rh is rather uncorrelated to the spread of the MOS transistors, a compensation circuit as shown in FIG. 7 is added (circuit already depicted in the general scheme of FIG. 5). The resistance Rx and the transistor Mx are respectively of the same type and size of the resistances (Ra . . . Rh) and of the MOS transistors (Ma . . . Mh) described in FIG. 4, while the transistor Mr has a conduction resistance equivalent to the resistance of the 2$^m$ transistor chain that forms the m-bit DAC.

By injecting the same current on the Rx, Mx series, as well as on the transistor Mr, the operational amplifier will drive the gate of the Mr transistor so as to equalize the two voltages V1 and V2. Therefore:

$$V1=(Rx+RMx)*I$$

(where RMx is the resistance of the Mx MOS)

$$V2=RMr*I$$

(where RMr is the resistance of the Mr MOS)
if $$V1=V2=>Rx+RMx=RMr$$

The output voltage of the operational amplifier (Vgate) may be then used to drive the gate of the MOS transistors that define the m-bit DAC. This ensures a satisfactory correlation between the value of the resistances Ra . . . Rh and the resistance RM (see FIG. 6). Finally, by linking the voltage Vpol (FIG. 7) to the central point of the m-bit DAC by means of a buffer B1 (FIG. 5), the Mr transistor will be subject to the same body effect as the MOS transistors of the m-bit DAC. Hence, the Vgate voltage applied to the MOS transistors will account, compensating them, also for the modulating effects due to the voltage variation applied on the m-m-bit DAC terminals.

The structure of digital-to-analog converter of the present invention has a compact layout, attaining a significant reduction of the occupied area of silicon, while performing satisfactorily in terms of differential and integral linearity errors.

That which is claimed is:

1. A digital-to-analog converter (DAC) for a relatively large number (n) of bits comprising:

a first DAC circuit including a resistive potentiometric string of $2^P+1$ resistances in series with $2^P$ taps for converting a first number (p) of most significative bits; and a second DAC circuit, coupled in cascade to the first DAC circuit, for converting a remaining number (m) of least significative bits wherein p+m=n, said second DAC circuit comprising a control circuit, a first set of $2^P$ MOS transistors, each MOS transistor having a current terminal coupled to a respective tap of said potentiometric string of $2^P+1$ resistances of said first DAC circuit and the other current terminal alternately coupled to a first common node and to a second common node, each MOS transistor of said first set also having a gate being driven by the control circuit, and a second set of $2^m-2$ MOS transistors, substantially identical to the MOS transistors of said first set, electrically connected in series between the first and second common nodes, all of the MOS transistors of said second set having gates connected in common and coupled to a bias voltage.

2. A DAC according to claim 1, wherein said second set of MOS transistors is selectably coupled between two of said $2^P$ taps of said first DAC circuit; and wherein the relative coupling position of said second set of MOS transistors between two selected taps of said first DAC circuit is realized through two MOS transistors of said first set operating as coupling switches and as end transistors of a chain of series-connected MOS transistors defining said second set of MOS transistors.

3. A DAC according to claim 2, further comprising $2^P+1$ resistances of value substantially identical to the series resistance of each of said MOS transistors of said first and second sets, and an equal number of switches operatively connected in series with a respective resistance of said $2^P+1$ resistances; wherein each resistance-switch pair is electrically coupled in parallel to the $2^P+1$ resistors connected in series with said first resistive potentiometric string; wherein said switches are also controlled by the control circuit; and wherein said switches have a series resistance substantially negligible in comparison to said resistance value.

4. A DAC according to claim 3, further comprising:
   an operational amplifier;
   a differential stage driving said operational amplifier, said differential stage comprising first and second branches, the first branch comprising a first MOS transistor substantially electrically identical to one of said switches and having the same resistance of said $2^P+1$ resistors, the second branch comprising a second MOS transistor substantially identical to said first MOS transistor, said first MOS transistor having a gate coupled to a supply node, said second MOS transistor having a gate coupled to an output of said operational; and
   means for coupling a common source node of said first and second MOS transistors of said differential stage to a potential of the central point of said second DAC circuit;
   the output of said operational amplifier being coupled to the gates connected in common for said second set of MOS transistors.

5. A digital-to-analog converter (DAC) for a relatively large number of bits comprising:
   a first DAC circuit including a resistive potentiometric string of resistances in series with respective taps for converting a first number of most significative bits; and
   a second DAC circuit, coupled in cascade to the first DAC circuit, for converting a remaining number of least significative bits, said second DAC circuit comprising
      a first set of MOS transistors, each MOS transistor having a current terminal coupled to a respective tap of said potentiometric string of resistances of said first DAC circuit and the other current terminal alternately coupled to a first common node and to a second common node, each MOS transistor of said first set also having a gate being driven by a control signal, and
      a second set of MOS transistors, substantially identical to the MOS transistors of said first set, electrically connected in series between the first and second common nodes, the MOS transistors of said second set having gates connected in common and coupled to a bias voltage.

6. A DAC according to claim 5, wherein said second set of MOS transistors is selectably coupled between two of said taps of said first DAC circuit; and wherein the relative coupling position of said second set of MOS transistors between two selected taps of said first DAC circuit is realized through two MOS transistors of said first set operating as coupling switches and as end transistors of a chain of series-connected MOS transistors defining said second set of MOS transistors.

7. A DAC according to claim 6, further comprising resistances of value substantially identical to the series resistance of each of said MOS transistors of said first and second sets, and an equal number of switches operatively connected in series with a respective resistance of said resistances; wherein each resistance-switch pair is electrically coupled in parallel to the resistors connected in series with said first resistive potentiometric string; wherein said switches are also controlled by the control circuit; and wherein said switches have a series resistance substantially negligible in comparison to said resistance value.

8. A DAC according to claim 7, further comprising:
   an operational amplifier;
   a differential stage driving said operational amplifier, said differential stage comprising first and second branches, the first branch comprising a first MOS transistor substantially electrically identical to one of said switches and having the same resistance of said resistors, the second branch comprising a second MOS transistor substantially identical to said first MOS transistor, said first MOS transistor having a gate coupled to a supply node, said second MOS transistor having a gate coupled to an output of said operational; and
   means for coupling a common source node of said first and second MOS transistors of said differential stage to a potential of the central point of said second DAC circuit;
   the output of said operational amplifier being coupled to the gates connected in common for said second set of MOS transistors.

9. A digital-to-analog converter (DAC) for a relatively large number of bits comprising:
   a first DAC circuit including a resistive potentiometric string of resistances in series with respective taps for converting a first number of most significative bits; and
   a second DAC circuit, coupled in cascade to the first DAC circuit, for converting a remaining number of least significative bits, said second DAC circuit comprising
      a first set of MOS transistors, each MOS transistor having a current terminal coupled to a respective tap of said potentiometric string of resistances of said first DAC circuit and the other current terminal alternately coupled to a first common node and to a second common node, each MOS transistor of said first set also having a gate being driven by a control signal, and
      a second set of MOS transistors, substantially identical to the MOS transistors of said first set, electrically connected in series between the first and second common nodes, the MOS transistors of said second set having gates connected in common and coupled to a bias voltage, said second set of MOS transistors being selectably coupled between two of said taps of said first DAC circuit.

10. A DAC according to claim 9, wherein the relative coupling position of said second set of MOS transistors between two selected taps of said first DAC circuit is realized through two MOS transistors of said first set operating as coupling switches and as end transistors of a chain of series-connected MOS transistors defining said second set of MOS transistors.

11. A DAC according to claim 10, further comprising resistances of value substantially identical to the series resistance of each of said MOS transistors of said first and second sets, and an equal number of switches operatively connected in series with a respective resistance of said resistances; wherein each resistance-switch pair is electrically coupled in parallel to the resistors connected in series with said first resistive potentiometric string; wherein said switches are also controlled by the control circuit; and wherein said switches have a series resistance substantially negligible in comparison to said resistance value.

12. A DAC according to claim 11, further comprising:

an operational amplifier;

a differential stage driving said operational amplifier, said differential stage comprising first and second branches, the first branch comprising a first MOS transistor substantially electrically identical to one of said switches and having the same resistance of said resistors, the second branch comprising a second MOS transistor substantially identical to said first MOS transistor, said first MOS transistor having a gate coupled to a supply node, said second MOS transistor having a gate coupled to an output of said operational; and means for coupling a common source node of said first and second MOS transistors of said differential stage to a potential of the central point of said second DAC circuit;

the output of said operational amplifier being coupled to the gates connected in common for said second set of MOS transistors.

* * * * *

UNITED STATES PATENT AND TRADEMARK OFFICE
CERTIFICATE OF CORRECTION

PATENT NO. : 5,943,000
DATED : August 24, 1999
INVENTOR(S) : Maurizio NESSI; Rinaldo CASTELLO; Giona FUCILI; Marcello LEONE; Annamaria ROSSI It is certified that error appears in the above-identified patent and that said Letters Patent is hereby corrected as shown below:

On the title page, item

[75] Inventors:  Strike: "Magneta"
Insert: -- Magenta --

Strike: "Genoa"
Insert: -- Genova --

Signed and Sealed this

Fourteenth Day of March, 2000

Attest:

Attesting Officer

Q. TODD DICKINSON

Commissioner of Patents and Trademarks

UNITED STATES PATENT AND TRADEMARK OFFICE
CERTIFICATE OF CORRECTION

PATENT NO. : 5,943,000
DATED : August 24, 1999
INVENTOR(S) : Maurizio Nessi; Rinaldo Castello; Giona Fucili; Marcello Leone; Annamaria Rossi Page 1 of 1

It is certified that error appears in the above-identified patent and that said Letters Patent is hereby corrected as shown below:

Title page,
Item [75] Inventors: delete "Magneta" insert -- Magenta --, and delete "Genoa" insert -- Genova --

Column 4,
Line 50, delete "$2^P+1$ resistances" insert -- $2^P$ resistances --, and delete "$2^P$ taps" insert --$2^P + 1$ taps --

Signed and Sealed this

Nineteenth Day of February, 2002

Attest:

*Attesting Officer*

JAMES E. ROGAN
*Director of the United States Patent and Trademark Office*